(12) United States Patent
Shiranita

(10) Patent No.: US 10,490,921 B2
(45) Date of Patent: Nov. 26, 2019

(54) CONNECTOR, IMAGE READING DEVICE, AND IMAGE FORMING APPARATUS

(71) Applicant: KYOCERA Document Solutions Inc., Osaka-shi, Osaka (JP)

(72) Inventor: Makoto Shiranita, Osaka (JP)

(73) Assignee: KYOCERA Document Solutions Inc., Osaka-shi, Osaka (JP)

(*) Notice: Subject to any disclaimer, the term of this patent is extended or adjusted under 35 U.S.C. 154(b) by 0 days.

(21) Appl. No.: 16/136,160

(22) Filed: Sep. 19, 2018

(65) Prior Publication Data

US 2019/0089078 A1 Mar. 21, 2019

(30) Foreign Application Priority Data

Sep. 20, 2017 (JP) ................................. 2017-179790

(51) Int. Cl.

| H01R 12/77 | (2011.01) |
|---|---|
| H04N 1/00 | (2006.01) |
| H01R 13/02 | (2006.01) |
| G03G 21/16 | (2006.01) |
| H01B 7/08 | (2006.01) |
| H05K 1/02 | (2006.01) |
| H01R 12/00 | (2006.01) |

(Continued)

(52) U.S. Cl.
CPC ......... *H01R 12/77* (2013.01); *G03G 21/1652* (2013.01); *H01B 7/08* (2013.01); *H01R 12/00* (2013.01); *H01R 13/025* (2013.01); *H04N 1/0083* (2013.01); *H04N 1/00278* (2013.01); *H04N 1/00557* (2013.01); *H05K 1/02* (2013.01)

(58) Field of Classification Search
CPC .............. H01R 13/193; H01R 23/6813; H01R 23/6833; H01R 23/684; H01R 12/79; H01R 12/77; H01R 12/00; H01R 12/772; H01R 12/89; H01R 13/025; H04N 1/00278; H04N 1/00557; H04N 1/0083; G03G 21/1652; H01B 7/08; H05K 1/02
USPC ................................................. 439/267, 260
See application file for complete search history.

(56) References Cited

U.S. PATENT DOCUMENTS 4,275,944 A * 6/1981 Sochor ................... H01R 12/89
439/267
4,553,804 A * 11/1985 Lapraik .................. H01R 12/88
439/267

(Continued)

FOREIGN PATENT DOCUMENTS

JP 2001332361 A 11/2001

*Primary Examiner* — Gary F Paumen
(74) *Attorney, Agent, or Firm* — Alleman Hall Creasman & Tuttle LLP

(57) ABSTRACT

A connector includes a housing, a switch, a set portion, and a contact terminal. An insertion port and a guide hole are formed in the housing. A flat cable is inserted in the insertion port. The guide hole is a through hole passing through the housing in a direction perpendicular to an insertion direction of the flat cable. When the switch moves along the guide hole in a removal direction opposed to the insertion direction, the set portion protrudes outside the housing from the insertion port. A connection portion of the flat cable is set on the set portion. When the switch moves along the guide hole in the insertion direction, the set portion is stored in an inner space of the housing. The contact terminal contacts and presses, in the inner space, a conductor provided in the connection portion.

8 Claims, 12 Drawing Sheets

(51) Int. Cl.
*H01R 12/79* (2011.01)
*H01R 12/89* (2011.01)

(56) References Cited

U.S. PATENT DOCUMENTS

| | | | | |
|---|---|---|---|---|
| 4,606,594 A | * | 8/1986 | Grabbe | H01R 12/88 |
| | | | | 439/260 |
| 6,213,804 B1 | * | 4/2001 | Matsumura | H01R 12/87 |
| | | | | 439/267 |
| 6,679,716 B2 | * | 1/2004 | Nakagawa | H01R 31/06 |
| | | | | 439/260 |
| 6,824,410 B1 | * | 11/2004 | Co | H01R 12/88 |
| | | | | 324/750.25 |
| 6,918,778 B2 | * | 7/2005 | Ruckerbauer | H01R 12/85 |
| | | | | 439/260 |
| 7,390,208 B1 | * | 6/2008 | Sabo | H01R 12/57 |
| | | | | 439/260 |
| 8,641,438 B2 | * | 2/2014 | Kamiya | H01R 12/721 |
| | | | | 439/260 |

* cited by examiner

CONNECTOR, IMAGE READING DEVICE, AND IMAGE FORMING APPARATUS

INCORPORATION BY REFERENCE

This application is based upon and claims the benefit of priority from the corresponding Japanese Patent Application No. 2017-179790 filed on Sep. 20, 2017, the entire contents of which are incorporated herein by reference.

BACKGROUND

The present disclosure relates to a connector for a flat cable, an image reading device, and an image forming apparatus.

A flat cable is connected to a connector mounted on a board in such a manner that data can be transmitted to a control circuit via the connector. A connection portion that is provided at one end of the flat cable is removably inserted and connected to the connector.

A connection portion that is provided at the other end of the flat cable is connected to, for example, a sensor unit. The sensor unit optically reads a document sheet on a contact portion and generates image data. The image data is transmitted to the control circuit via the flat cable and the connector.

Contact terminals are provided in a housing of the connector. When the flat cable is inserted in the connector, the contact terminals respectively abut on flat conductors that are included in the connection portion of the flat cable and exposed to outside.

In the housing, holding members are provided in such a way as to face the contact terminals. The holding members are separated from the contact terminals when the connection portion provided at one end of the flat cable is near an insertion port of the housing. When inserted, the connection portion is sandwiched between the holding members and the contact terminals. As the connection portion is pushed from the insertion port to the depth of the housing, the holding members press the flat cable, causing the flat conductors to contact and press the contact terminals.

SUMMARY

A connector according to an aspect of the present disclosure includes a housing, a switch, a set portion, a contact terminal, and a mounting terminal. The housing has an insertion port in which a flat cable is inserted, and a guide hole which is a through hole passing through the housing in a direction perpendicular to a predetermined insertion direction of the flat cable and elongated in the insertion direction. The switch is configured to move along the guide hole in the insertion direction and a removal direction that is opposite to the insertion direction. A connection portion of the flat cable is set on the set portion. The set portion includes a set surface that moves in the removal direction and protrudes outside the housing from the insertion port as the switch moves in the removal direction. The set surface moves in the insertion direction and is stored in an inner space of the housing as the switch moves in the insertion direction. The contact terminal includes a pressure contact portion configured to, in the inner space, contact and press, in a direction perpendicular to the insertion direction, a conductor provided in the connection portion. The mounting terminal is electrically connected to the contact terminal and protrudes with respect to an outer surface of the housing.

A image reading device and an image forming apparatus according to other aspects of the present disclosure include the connector.

This Summary is provided to introduce a selection of concepts in a simplified form that are further described below in the Detailed Description with reference where appropriate to the accompanying drawings. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The following describes an embodiment of the present disclosure with reference to the accompanying drawings. It should be noted that the following embodiment is an example of a specific embodiment of the present disclosure and should not limit the technical scope of the present disclosure.

Figure 1:
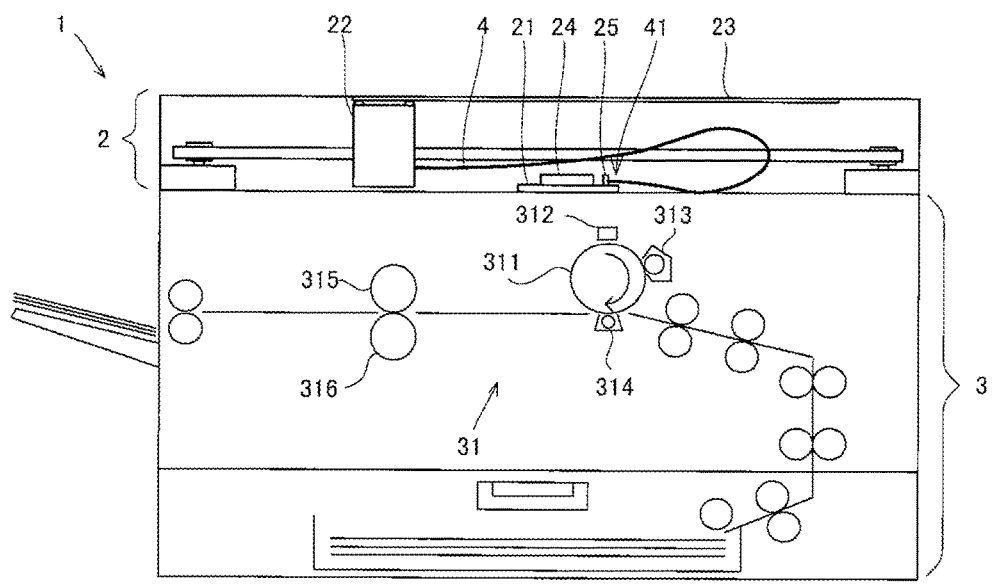
FIG. 1 is a diagram showing a configuration of an image forming apparatus according to an embodiment of the present disclosure.
Figure 2:
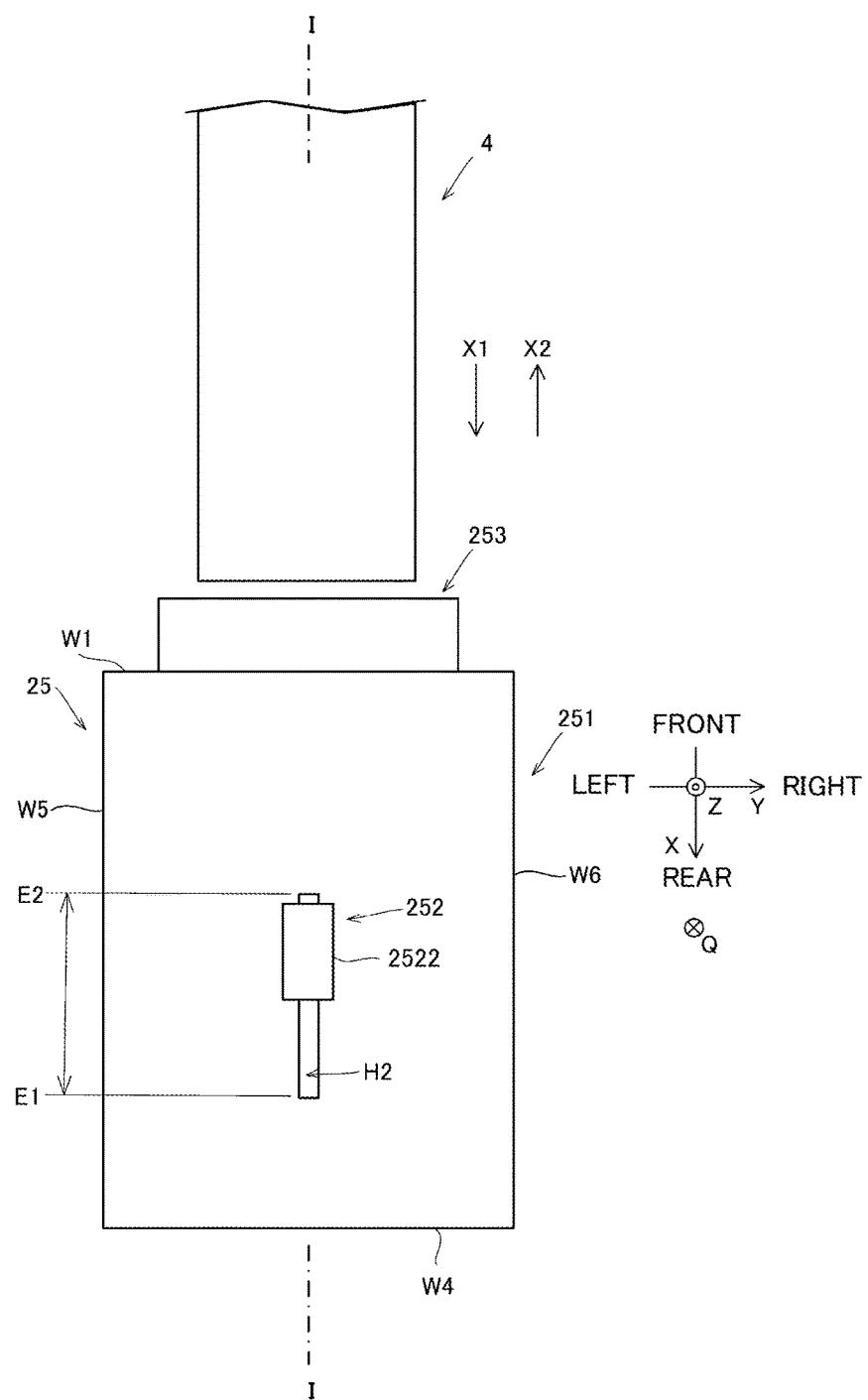
FIG. 2 is a top planar view of a connector shown in FIG. 1.

In FIG. 1, an image forming apparatus 1 is, for example, a copier, a printer, a facsimile machine, or a multifunction peripheral. The multifunction peripheral has a plurality of functions such as a copy function, a print function, and a facsimile function.

The image forming apparatus 1 includes an image reading device 2 and a main body device 3.

The image reading device 2 is provided in an upper portion of the main body device 3. It is noted that the image reading device 2 may be, for example, a scanner independent of the image forming apparatus 1. In addition, the whole of the image forming apparatus 1 that includes the image reading device 2, may be regarded as an example of an image reading device according to the present disclosure.

The image reading device 2 includes a control circuit board 21, a sensor unit 22, and a contact portion 23.

A control circuit 24 and a connector 25 are mounted on the control circuit board 21. In addition, many pattern wirings (not shown) are formed on the control circuit board 21 so as to electrically connect the control circuit 24 and the connector 25.

The control circuit 24 is, for example, an integrated circuit that includes a CPU, a ROM, a RAM, and non-volatile memory. The CPU executes a program that has been stored in advance in the ROM, by using the RAM as a work area. The CPU records various types of data onto the non-volatile memory. This allows the CPU to comprehensively control the image forming apparatus 1 and execute various processes such as an image reading process and an image forming process.

It is noted that the control circuit board 21 may be provided in the main body device 3. In addition, the control circuit 24 may be an electronic circuit such as an ASIC (Application Specific Integrated Circuit) or a DSP (Digital Signal Processor).

A connection portion 4 that is provided at one end of a flat cable is removably inserted and connected to the connector 25.

The sensor unit 22 is an unmagnification optical system CIS (Contact Image Sensor) or a reduction optical system sensor unit. A connection portion 4 that is provided at the other end of the flat cable is connected to the sensor unit 22.

The sensor unit 22 optically reads an image from a document sheet on the contact portion 23 and generates image data. The image data is transmitted to the control circuit 24 via the flat cable and the connector 25.

The main body device 3 includes an image former 31. The image former 31 includes a photoconductor drum 311, a charger 312, a developing device 313, a transfer device 314, a fixing roller 315, and a pressure roller 316, and forms, by an electrophotographic system or an inkjet system, an image on a sheet based on the image data received by the control circuit 24.

Various parts (not shown) other than the control circuit 24 and the connector 25 are also mounted on the control circuit board 21 at high density. As a result, depending on the mounting location of the mounted connector 25, a worker may not be able to visually confirm a position of a flat cable insertion port provided in the connector 25. In that case, it would be difficult for the worker to insert the flat cable in the connector 25, and the flat cable may be damaged during the work.

On the other hand, the image reading device 2 according to the present embodiment includes the connector 25 in which the flat cable can be easily inserted.

The following describes the connector 25 with reference to FIG. 2 to FIG. 12.

In FIG. 2 to FIG. 12, the X axis, the Y axis and the Z axis are perpendicular to each other and represent a front-rear direction, a left-right direction and an up-down direction of the connector 25, respectively. In addition, the X axis, the Y axis and the Z axis respectively indicate a flat cable insertion/removal direction X, a width direction Y and a thickness direction Z of the connector 25. Furthermore, the flat cable insertion/removal direction X is composed of an X1 direction and an X2 direction that are opposite to each other and respectively indicate a flat cable insertion direction and a flat cable removal direction.

The connector 25 includes a housing 251, a switch 252, a set portion 253, a positioning portion 254, a pressing portion 255, mounting terminals 256, and contact terminals 257.

The housing 251 is made of a resin material having electrical insulation, and includes a first wall W1, a second wall W2, a third wall W3, a fourth wall W4, a fifth wall W5, and a sixth wall W6.

The first wall W1 to the sixth wall W6 surround an inner space S of the housing 251. In the inner space S, the set portion 253, the positioning portion 254, the pressing portion 255, the mounting terminals 256, and the contact terminals 257 are stored.

The first wall W1 is a front panel of the connector 25. An insertion port H1 is formed in the first wall W1, the insertion port H1 extending in the width direction Y (namely, the left-right direction). The insertion port H1 passes through the first wall W1 in the insertion/removal direction X and is communicated with the inner space S. The connection portion 4 of the flat cable is inserted in the insertion port H1.

The second wall W2 is an upper panel of the connector 25, and includes an upper outer surface F21 and an upper inner surface F22.

The upper outer surface F21 and the upper inner surface F22 are both flat and face each other in parallel, wherein the upper outer surface F21 is positioned above the upper inner surface F22.

A guide hole H2 is formed in the second wall W2. The guide hole H2 passes through the second wall W2 in the up-down direction. The guide hole H2 is a through hole that passes through in a direction perpendicular to the insertion/removal direction X and is elongated in the insertion/removal direction. Specifically, the guide hole H2 extends parallel to the insertion/removal direction X, and has a slit-like rectangular shape when viewed from above.

Hereinafter, an end of the guide hole H2 on the X1 direction side is referred to as an insertion-direction-side guide end E1, and an end of the guide hole H2 on the X2 direction side is referred to as a removal-direction-side guide end E2.

The third wall W3 is a lower panel of the connector 25, and faces the second wall W2 in the up-down direction. The third wall W3 includes a lower outer surface F31 and a lower inner surface F32.

The lower outer surface F31 and the lower inner surface F32 are both flat and face each other in parallel, where the lower outer surface F31 is positioned below the lower inner surface F32.

When the connector 25 is mounted, the lower outer surface F31, as a mounting surface, comes in contact with the control circuit board 21.

The fourth wall W4 is a rear panel of the connector 25, and faces the first wall W1 in the front-rear direction. The fourth wall W4 includes an insertion-direction-side outer surface F41 and an insertion-direction-side inner surface F42.

The insertion-direction-side outer surface F41 faces the insertion-direction-side inner surface F42, wherein the insertion-direction-side outer surface F41 is in rear of the insertion-direction-side inner surface F42.

The insertion-direction-side inner surface F42 is separated in the X1 direction with respect to the insertion-direction-side guide end E1 by a predetermined separation distance D1.

The fifth wall W5 and the sixth wall W6 face each other in the left-right direction. It is noted that the guide hole H2 may be formed in the fifth wall W5 or the sixth wall W6 instead of the second wall W2.

The switch 252 includes an insertion portion 2521, an operation portion 2522, and a holding portion 2523.

Figure 5:
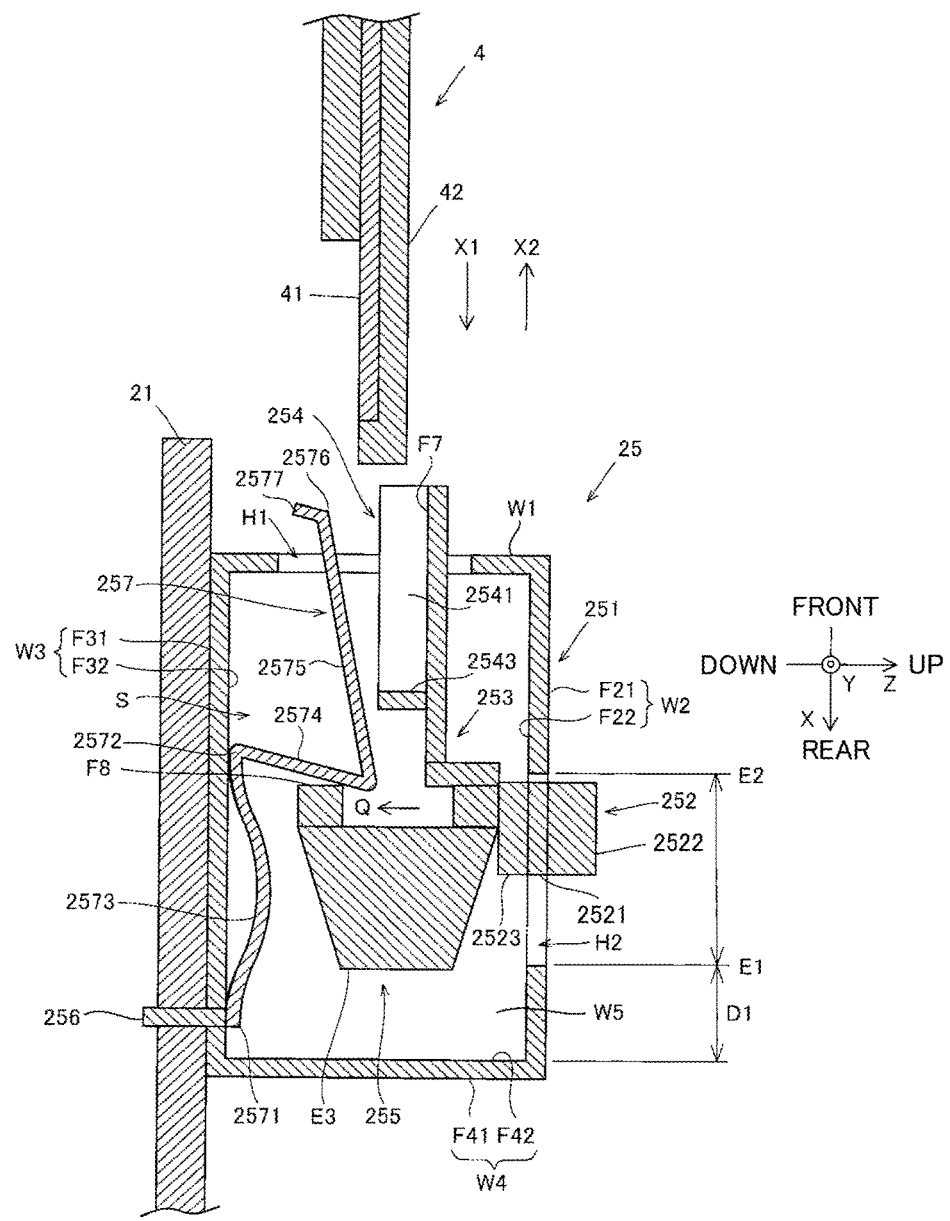
FIG. 5 is a longitudinal section view of the connector taken along a chain line I-I shown in FIG. 2.

As shown in at least FIG. 5, the insertion portion 2521 is inserted in the guide hole H2. The insertion portion 2521 matches the second wall W2 in a size in the up-down direction (hereinafter, the size is referred to as an up-down direction size). The insertion portion 2521 matches the guide hole H2 in a size in the left-right direction (hereinafter, the size is referred to as a left-right direction size). In addition, the insertion portion 2521 is smaller than the guide hole H2 in a side in the front-rear direction (hereinafter, the size is referred to as a front-rear direction size).

The operation portion 2522 is fixed to an upper portion of the insertion portion 2521, and protrudes outside the housing 251 with respect to the upper outer surface F21 of the housing 251.

The holding portion 2523 is fixed to a lower portion of the insertion portion 2521, and protrudes toward the inner space S with respect to the upper inner surface F22 of the housing 251.

The left-right direction sizes of the operation portion 2522 and the holding portion 2523 are each larger than the left-right direction size of the guide hole H2 when viewed from above. With this configuration, the holding portion 2523 and the operation portion 2522 hold the edge of the guide hole H2 in the first wall W1.

The worker applies a force in the X1 direction or the X2 direction to the operation portion 2522 by operating the operation portion 2522. In response to this, the insertion portion 2521 moves along the guide hole H2 in the X1 direction or the X2 direction within a range between the insertion-direction-side guide end E1 and the removal-direction-side guide end E2. This allows the switch 252 to move in the insertion/removal direction X along the guide hole H2.

The set portion 253 is fixed to the holding portion 2523 via the pressing portion 255 that is described below.

The set portion 253 extends in the width direction Y. The set portion 253 is smaller than the insertion port H1 in sizes in the left-right direction and the up-down direction. The set portion 253 extends in the X2 direction from an end of the holding portion 2523 on the X2 direction side by a predetermined distance. The front-rear direction size of the set portion 253 is preset to satisfy the following two conditions.

A first condition is that the set portion 253 does not protrude from the insertion port H1 when the insertion portion 2521 is positioned at the insertion-direction-side guide end E1 and the switch 252 is in contact with the housing 251.

A second condition is that the set portion 253 protrudes from the insertion port H1 before the insertion portion 2521 reaches the removal-direction-side guide end E2.

A lower end surface of the set portion 253 includes a set surface F7 on which the connection portion 4 of the flat cable is set. Specifically, in a case where the flat cable is a multicore type, as shown in at least FIG. 6, in the connection portion 4, a plurality of flat conductors 41 are arranged in parallel in the width direction of the flat cable. In addition, in the connection portion 4, a cover 42 is not provided in one side in the thickness direction of the flat cable such that the plurality of flat conductors 41 are exposed to outside.

Figure 7:
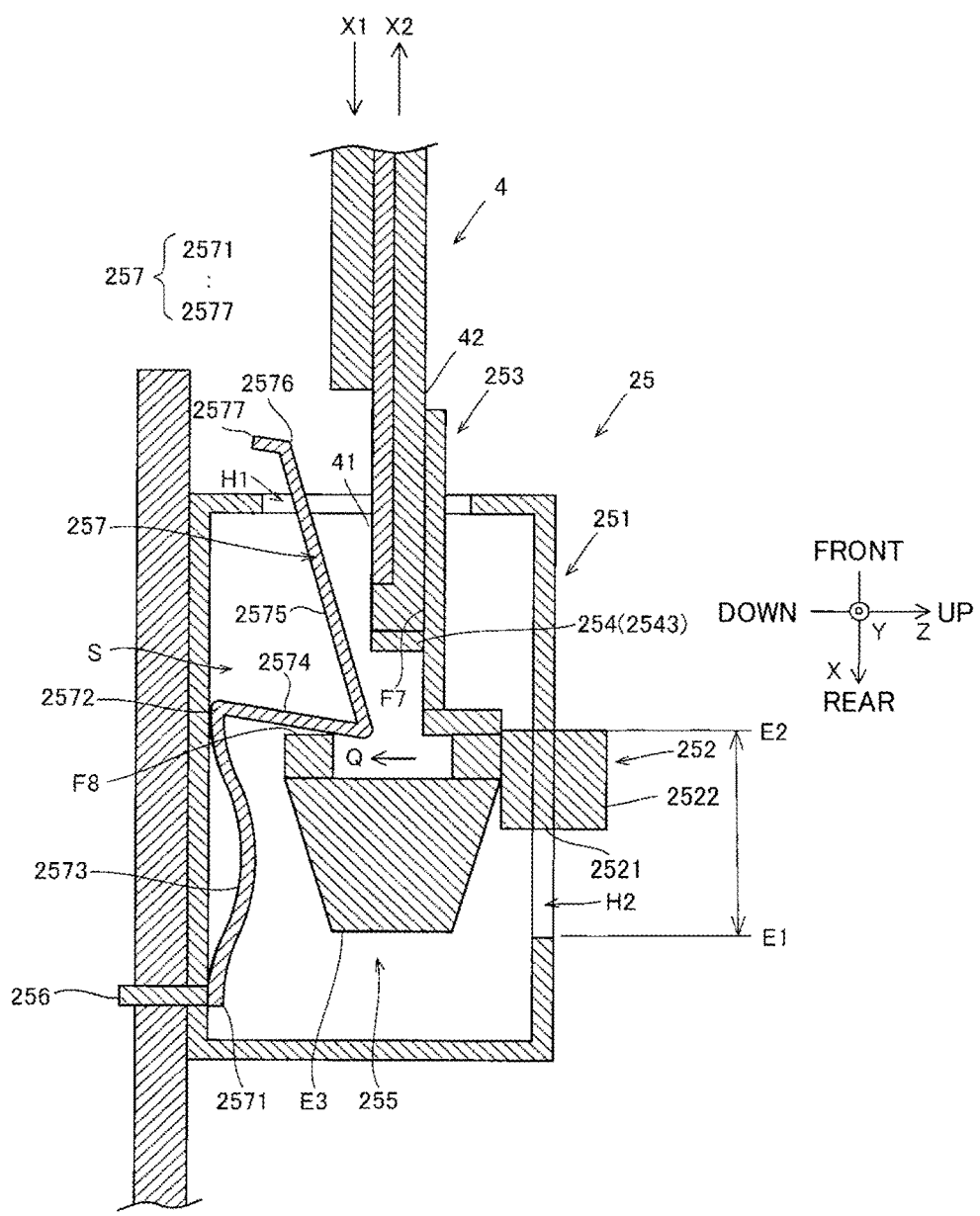
FIG. 7 is a longitudinal section view of the connector in a state where a connection portion of the flat cable has been set on a set portion.

As shown in at least FIG. 7, the worker sets the connection portion 4 onto the set surface F7 such that the cover 42 side of the connection portion 4 abuts on the set surface F7.

The set surface F7 is a flat surface parallel to the insertion/removal direction X and the width direction Y. However, not limited to this, the set surface F7 may not be a flat surface as far as it is not inclined with respect to the front-rear direction, the left-right direction, and the up-down direction. For example, the set surface F7 may be an uneven surface that is uniformly uneven.

Figure 6:
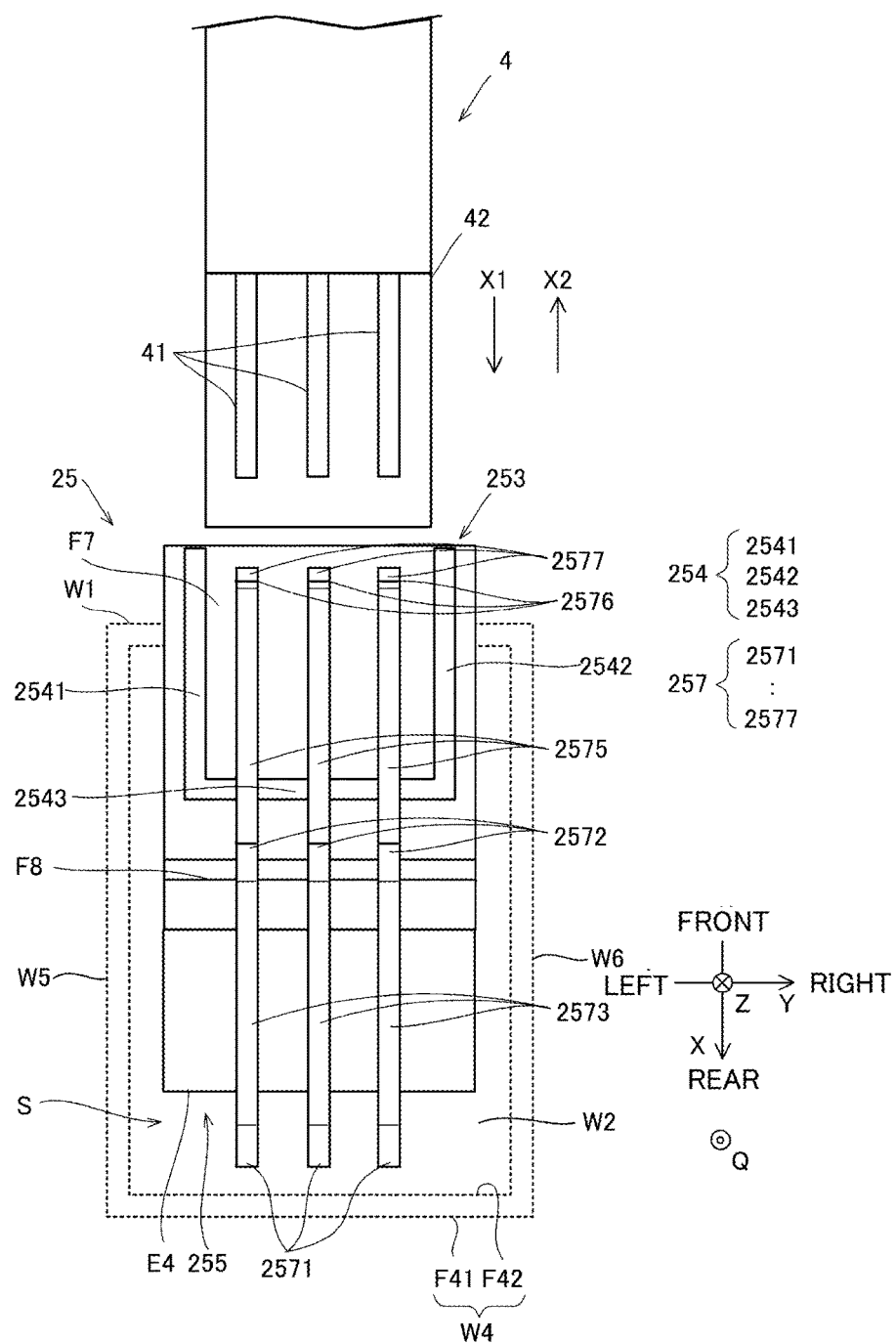
FIG. 6 is a planar view of a set portion, a pressing portion, and contact terminals shown in FIG. 5, viewed from below.

As shown in at least FIG. 5 and FIG. 6, the positioning portion 254 includes a first projection 2541, a second projection 2542, and a third projection 2543 that project from the set surface F7.

The first projection 2541 and the second projection 2542 are separated from each other in the width direction Y on the set surface F7 by a distance that matches the width of the connection portion 4.

The third projection 2543 is provided on the set surface F7 at a predetermined position on the X1 direction side with respect to the first projection 2541 and the second projection 2542.

The third projection 2543 may be connected to or separated from the first projection 2541 and the third projection 2543.

As shown in at least FIG. 7, the third projection 2543 has a height that is larger than the thickness of the connection portion 4 with respect to the set surface F7. This prohibits a removal-direction-side coupling portion 2575 of the contact terminal 257 that is described below, from abutting on the connection portion 4.

As the switch 252 moves in the X2 direction, the set surface F7 moves in the X2 direction and protrudes outside the housing 251 from the insertion port H1.

Figure 8:
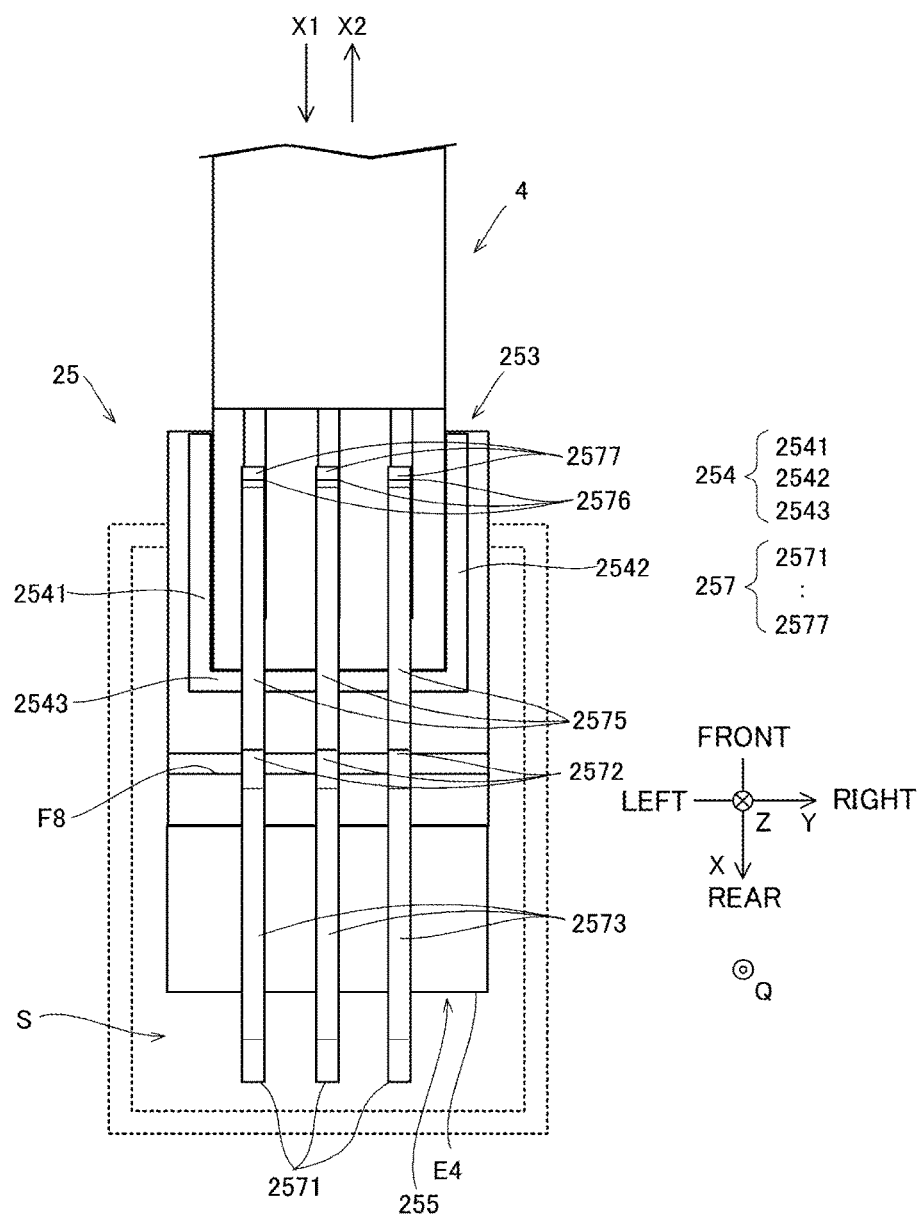
FIG. 8 is a planar view of the set portion, the pressing portion, and the contact terminals viewed from below in the state where the connection portion of the flat cable has been set on the set portion.

Specifically, the worker operates the operation portion 2522 so that the insertion portion 2521 reaches the removal-direction-side guide end E2 and the operation portion 2522 abuts on the housing 251. During this process, as shown in FIG. 7 and FIG. 8, the set portion 253 and the set surface F7 protrude outside the housing 251 from the insertion port H1.

The worker sets the connection portion 4 to an area on the set surface F7 surrounded by the first projection 2541 to the third projection 2543.

Figure 9:
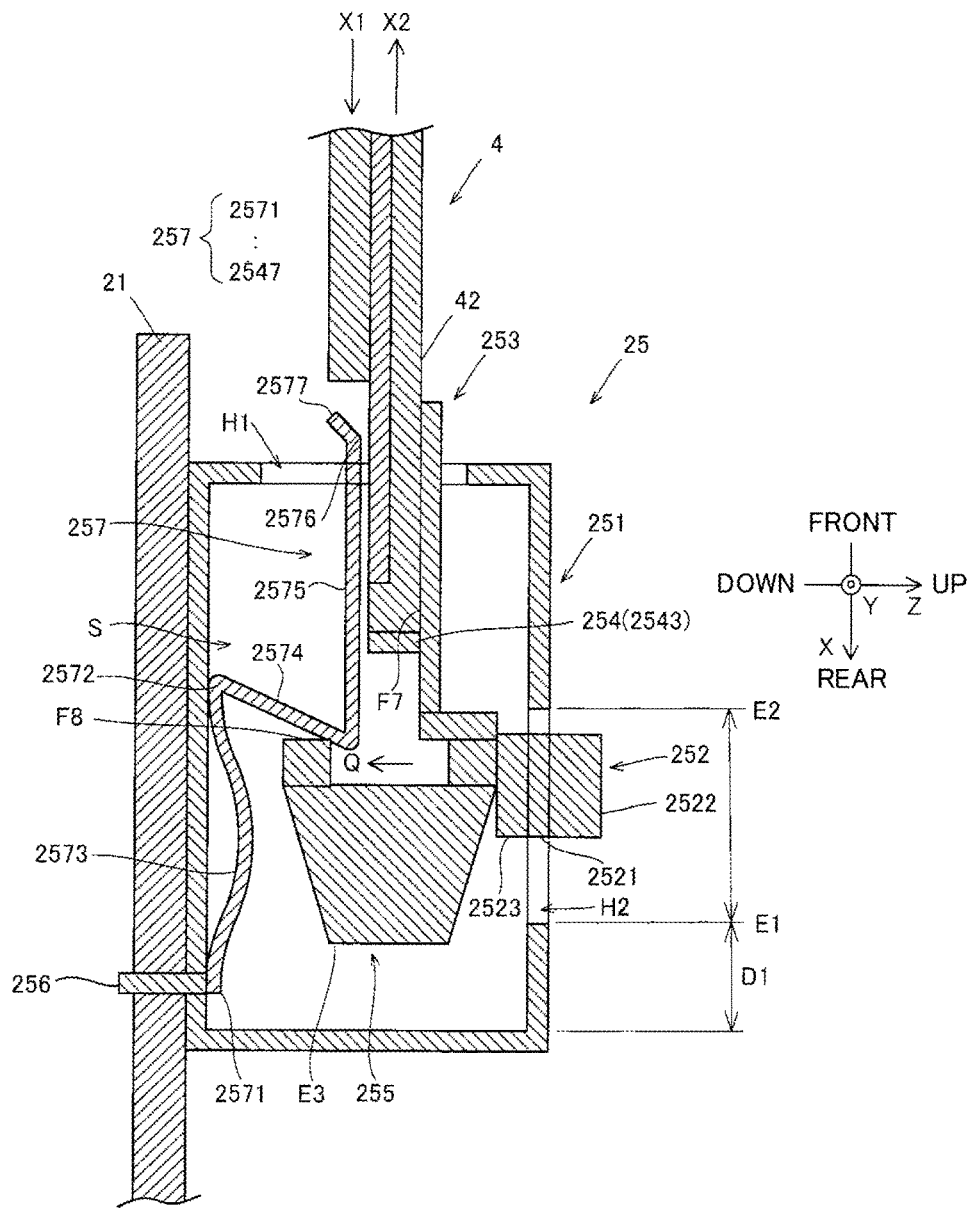
FIG. 9 is a longitudinal section view of the connector in a state where an insertion portion shown in FIG. 5 is between an insertion-direction-side guide end and a removal-direction-side guide end.
Figure 10:
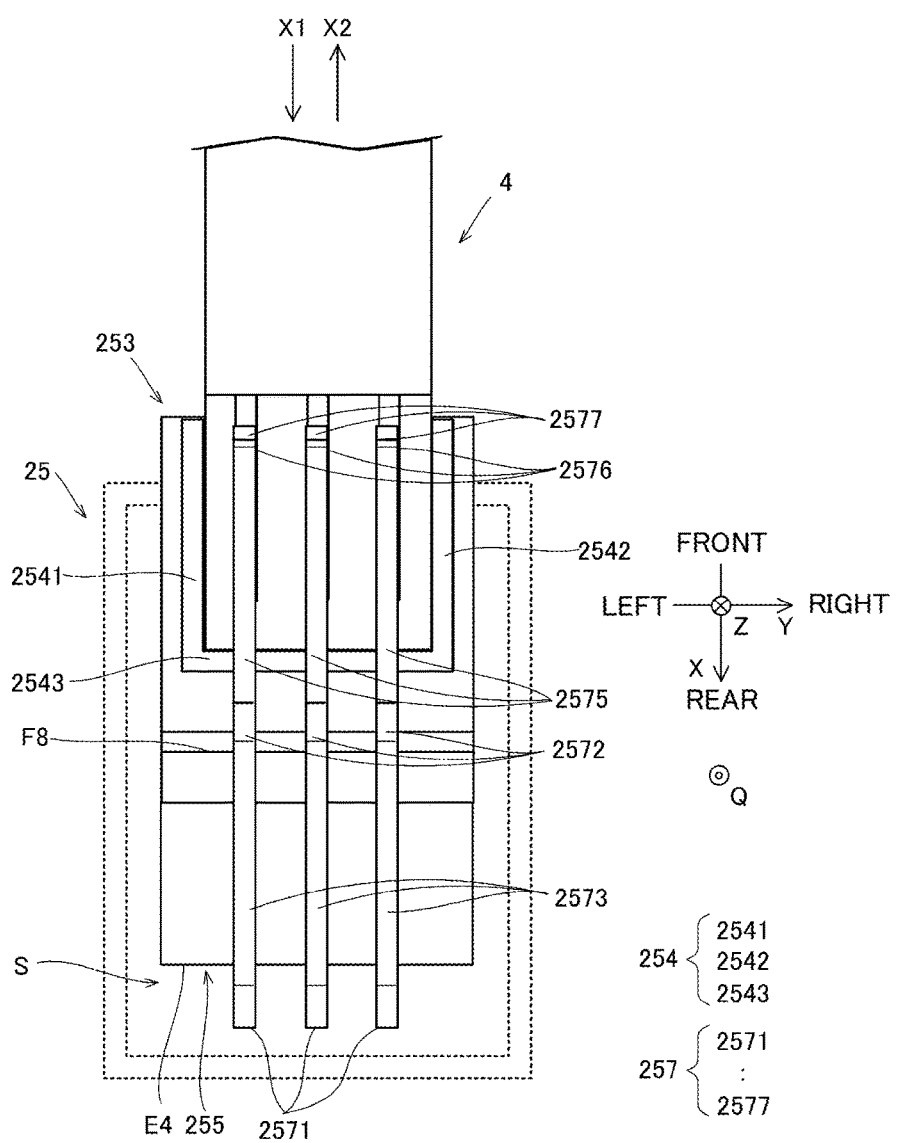
FIG. 10 is a planar view of the set portion, the pressing portion, and the contact terminals viewed from below in the state where the insertion portion shown in FIG. 5 is between the insertion-direction-side guide end and the removal-direction-side guide end.

As shown in FIG. 9 and FIG. 10, after setting the connection portion 4, the worker moves the switch 252 in the X1 direction while holding the connection portion 4. In response to this, the set surface F7 is moved in the X1 direction and stored in the inner space S from the insertion port H1.

Figure 11:
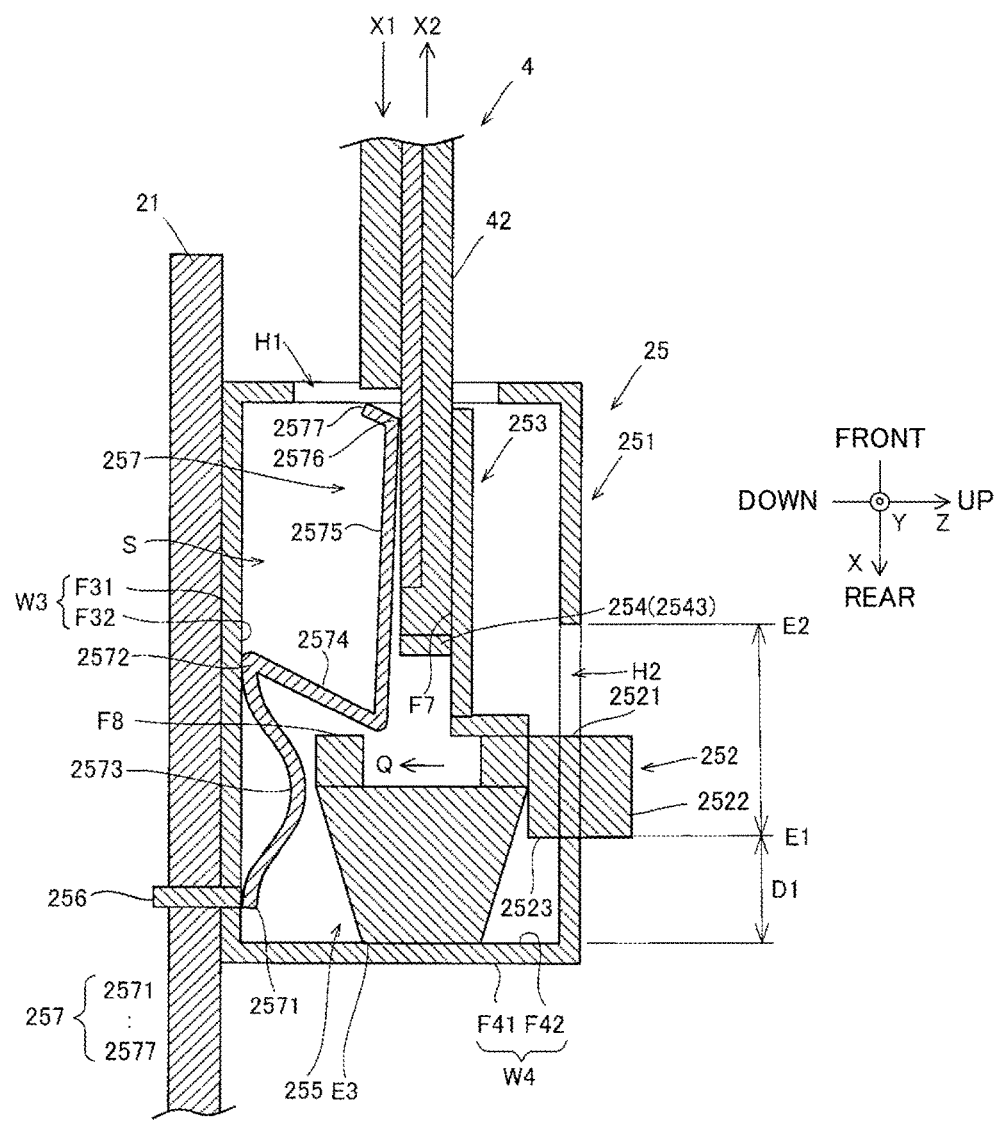
FIG. 11 is a longitudinal section view of the connector in a state where the insertion portion shown in FIG. 5 has reached the insertion-direction-side guide end.
Figure 12:
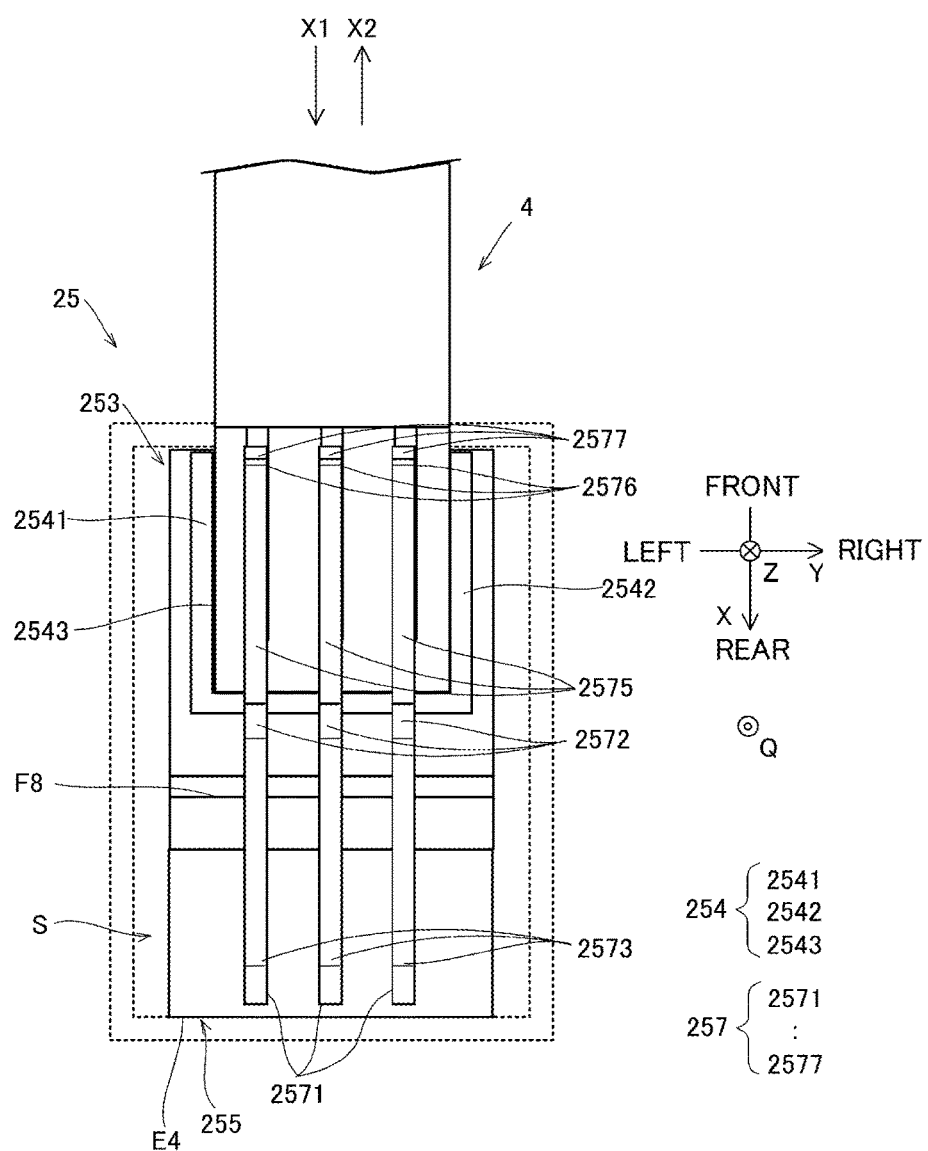
FIG. 12 is a planar view of the set portion, the pressing portion, and the contact terminals viewed from below in the state where the insertion portion shown in FIG. 5 has reached the insertion-direction-side guide end.

As shown in FIG. 11 and FIG. 12, during a process in which the switch 252 is moved until it reaches the insertion-direction-side guide end E1, or when the switch 252 has reached the insertion-direction-side guide end E1, a pressure contact portion 2576 (described below) of the contact terminal 257 contacts and presses the flat conductor 41.

With the above-described configuration where the set surface F7 is exposed to outside the housing 251, even if the connector 25 is mounted at such a position that the insertion port H1 is hardly seen, the worker can insert the connection portion 4 in the connector 25 without visually confirming the position of the insertion port H1.

In addition, the movement direction of the set surface F7 is regulated by the insertion portion 2521 and the guide hole H2. In other words, the movement direction of the set surface F7 is hardly shifted from the insertion/removal direction X. As a result, during an insertion of the connection portion 4, the worker only needs to operate the switch 252 in the X1 direction while lightly pressing the connection portion 4 to the set surface F7. This prevents occurrence of a so-called oblique insertion or the like that would apply an excessive stress to the connection portion 4.

It is noted here that in the following descripion, a direction in which the first projection 2541 to the third projection 2543 project and which is perpendicular to the insertion/removal direction X and the width direction Y, is referred to as a projection direction Q.

The pressing portion 255 is a first pressing portion and a second pressing portion, and as shown in at least FIG. 5, fixed to the holding portion 2523 of the switch 252. In the inner space S, the pressing portion 255 extends from the holding portion 2523 in the projection direction Q. An end of the pressing portion 255 on the projection direction Q side is separated from the lower inner surface F32 by a predetermined distance. In addition, the pressing portion 255 includes a pressing surface F8 at an end of the pressing portion 255 itself on the X2 direction side.

The pressing surface F8 is a first pressing surface and a second pressing surface and is a flat surface parallel to the left-right direction and the up-down direction. Not limited to this, the pressing surface F8 may be a curved surface. The pressing surface F8 is separated in the X1 direction with respect to the third projection 2543 by a predetermined distance. In addition, the pressing surface F8 is separated in the projection direction Q with respect to the set surface F7 by a predetermined distance. Specifically, the pressing surface F8 is provided on the projection direction Q side of the third projection 2543.

In addition, the pressing portion 255 includes an insertion-direction-side end E3 that is an end in the X1 direction. The insertion-direction-side end E3 is separated in the X1 direction with respect to the insertion-direction-side guide end E1 by the separation distance D1.

The pressing portion 255 moves in the X1 direction as the switch 252 moves in the X1 direction. As shown in FIG. 11 and FIG. 12, when the switch 252 reaches the insertion-direction-side guide end E1, it abuts on the housing 251. At the same time, the insertion-direction-side end E3 abuts on the insertion-direction-side inner surface F42 of the fourth wall W4. At this time, the pressure contact portion 2576 contacts and presses the flat conductor 41, and the connection portion 4 abuts on the third projection 2543.

As a result, at a time when the switch 252 has reached the insertion-direction-side guide end E1, even if the worker further applies a force in the X1 direction, the set surface F7 does not move in the X1 direction due to a reaction force received from the insertion-direction-side inner surface F42. In other words, this configuration makes it difficult for the pressure contact portions 2576 to slide on the flat conductors 41, thereby making it possible to reduce wear of the flat conductors 41.

Figure 3:
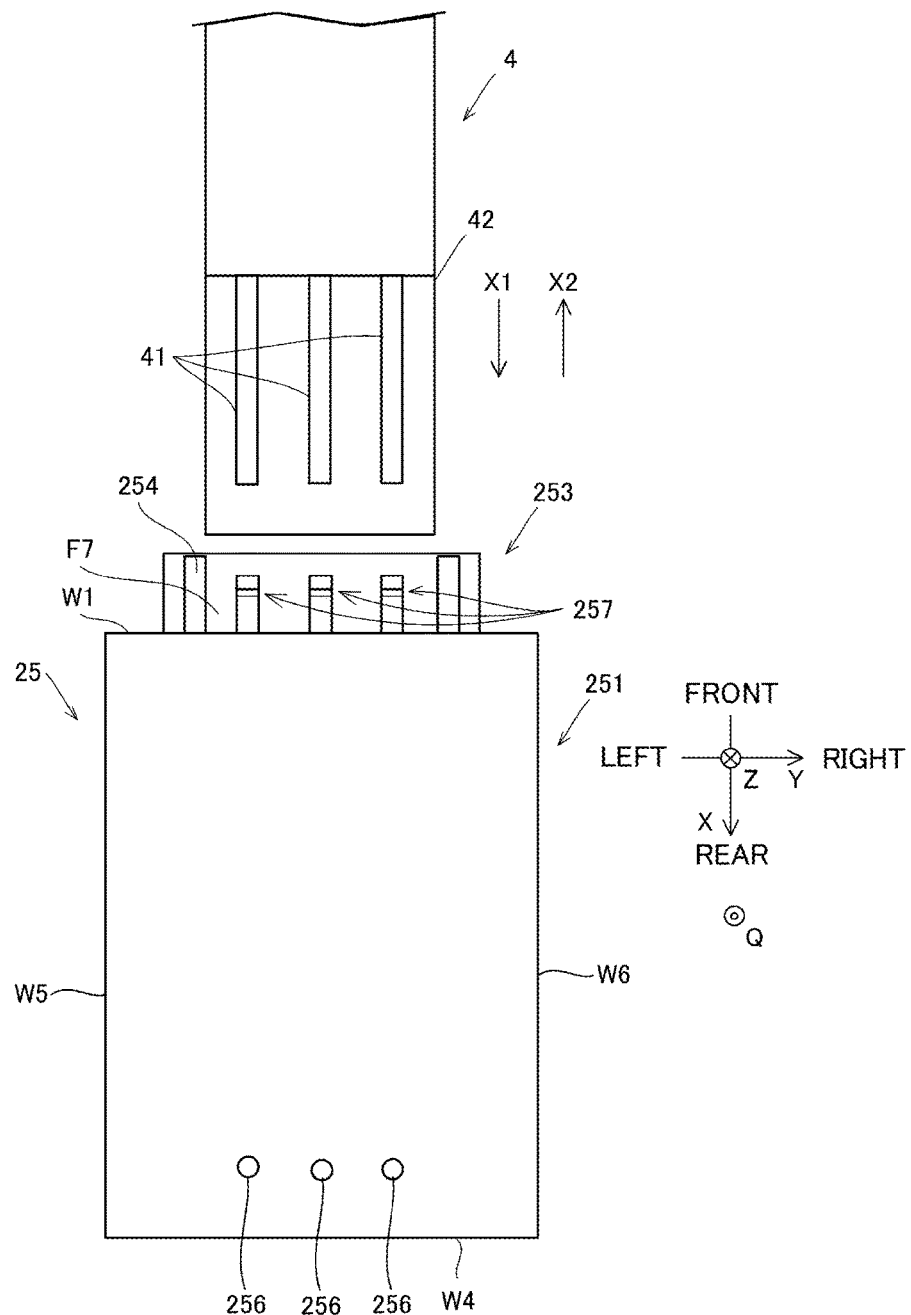
FIG. 3 is a bottom planar view of the connector shown in FIG. 1.

The mounting terminals 256 are made of a conductive material, and as shown in FIG. 3, provided as many as the number of the flat conductors 41.

Figure 4:
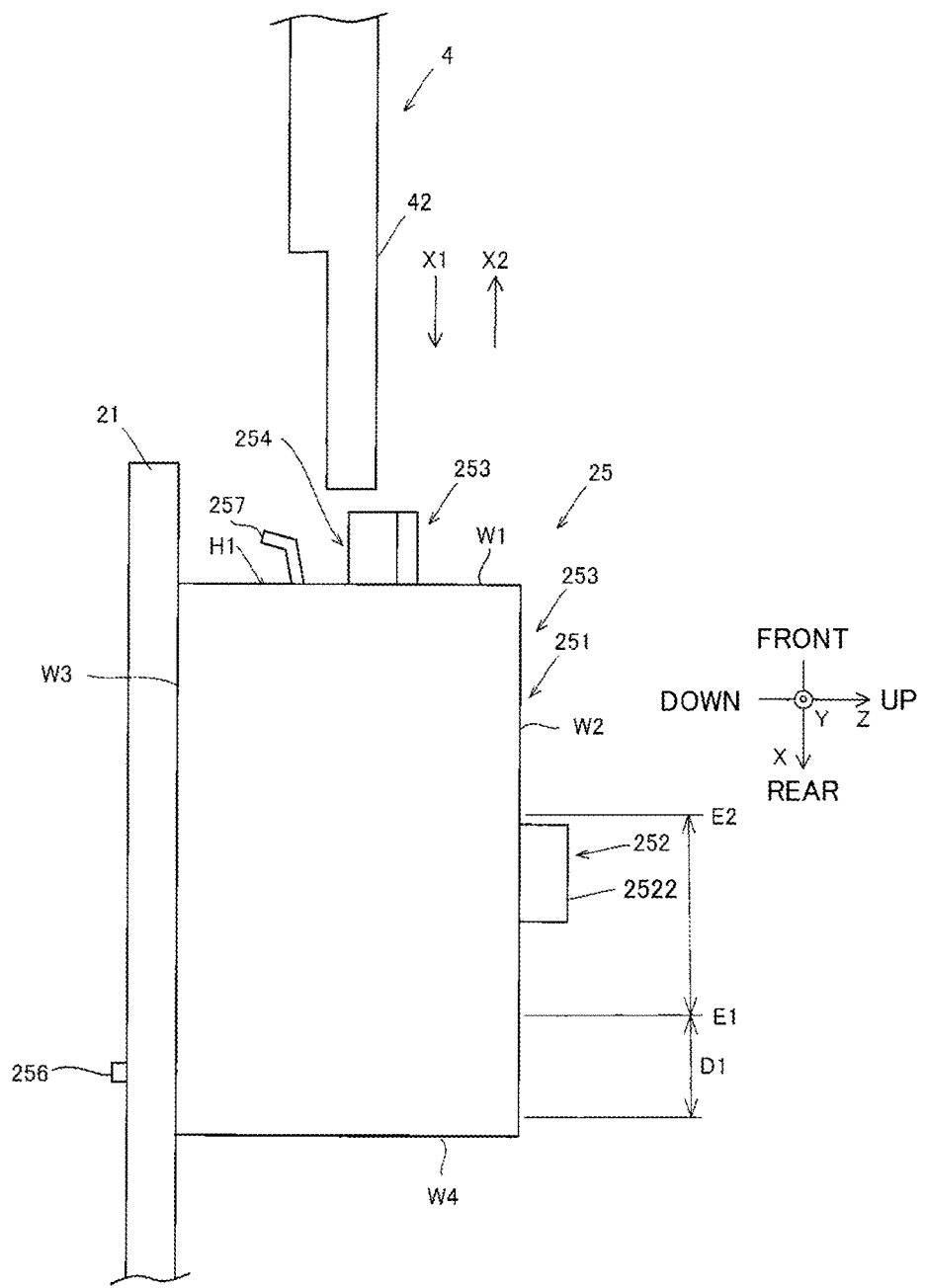
FIG. 4 is a right side view of the connector shown in FIG. 1.

As shown in FIG. 4 and FIG. 5, each of the mounting terminals 256 passes through the third wall W3 at a position close to the insertion-direction-side inner surface F42 in the inner space S, and protrudes from the outer surface of the housing 251, more specifically, protrudes outside the housing 251 with respect to the lower outer surface F31.

The mounting terminals 256 are electrically connected to the contact terminals 257 that are described below, and joined to pattern conductors (not shown) formed on the control circuit board 21 by soldering or the like.

The contact terminals 257 are made of a conductive material, and as shown in FIG. 3, provided as many as the number of the mounting terminals 256. As shown in at least FIG. 5, each of the contact terminals 257 includes a fixing portion 2571, a support portion 2572, an insertion-direction-side coupling portion 2573, a pressed portion 2574, the removal-direction-side coupling portion 2575, the pressure contact portion 2576, and a removal-direction-side end portion 2577.

The fixing portion 2571 and the support portion 2572 are provided more on the projection direction Q side than the pressing portion 255 in the inner space S.

Specifically, the fixing portion 2571 and the support portion 2572 are separated in the projection direction Q with respect to an end of the pressing portion 255 on the projection direction Q side by a predetermined distance, and are provided on the lower inner surface F32 of the third wall W3.

In addition, the fixing portion 2571 is fixed to the third wall W3 of the housing 251, and electrically connected to the mounting terminal 256.

The support portion 2572 is a first support portion and a second support portion, and separated in the X2 direction with respect to the fixing portion 2571 by a predetermined distance. It is noted that the support portion 2572 is not fixed to the third wall W3.

As shown in FIG. 11, when the pressed portion 2574 is not pressed by the pressing surface F8, the support portion 2572 is separated with respect to the fixing portion 2571 by a predetermined distance and stands still on the lower inner surface F32, wherein the pressed portion 2574 is described below.

As shown in FIG. 7, FIG. 9, and FIG. 11, when the pressed portion 2574 is pressed by the pressing portion 255, the support portion 2572 slides in the insertion/removal direction X on the lower inner surface F32 within a predetermined range in the insertion/removal direction X.

The insertion-direction-side coupling portion 2573 couples the fixing portion 2571 with the support portion 2572. As shown in FIG. 11, while the support portion 2572 stands still, the insertion-direction-side coupling portion 2573 is largely bent in an opposite direction to the projection direction Q. On the other hand, as shown in FIG. 9 and FIG. 11, while the support portion 2572 slides in the insertion/removal direction X, the insertion-direction-side coupling portion 2573 is elastically deformed and expands and contracts in the insertion/removal direction X.

It is noted that the insertion-direction-side coupling portion 2573 is configured not to contact the pressing portion 255 while the pressing portion 255 is moving in the insertion/removal direction X. With this configuration, it is possible to prevent wear of the insertion-direction-side coupling portion 2573 and the pressing portion 255.

The pressed portion 2574 is a first pressed portion and a second pressed portion, and at one end thereof, coupled with the support portion 2572. The pressed portion 2574 overlaps with the pressing surface F8 in a planar view viewed in the X2 direction, and is interposed between the third projection 2543 and the pressing surface F8 in a planar view viewed in the projection direction Q. As shown in FIG. 7 and FIG. 9, during a process in which the pressing portion 255 moves in the insertion/removal direction X, the pressed portion 2574 is pressed by the pressing surface F8.

Specifically, as shown in FIG. 11, when the pressed portion 2574 is not pressed by the pressing portion 255, the pressed portion 2574 stands still in the inner space S. At this time, the pressed portion 2574, in a state of being inclined in the insertion/removal direction X, extends in an opposite direction to the projection direction Q with respect to the position of the support portion 2572. The pressed portion 2574 extends up to a position that is between the third projection 2543 and the pressing surface F8 and is separated from the pressing surface F8 in the X2 direction by a predetermined distance.

During a process in which, as shown in FIG. 11, FIG. 9, and FIG. 7, the insertion portion 2521 moves from the insertion-direction-side guide end E1 to the removal-direction-side guide end E2, the pressed portion 2574 is pressed by the pressing surface F8 and moves in the X2 direction as shown in FIG. 9 and FIG. 7. As the pressed portion 2574 moves in the X2 direction, the insertion-direction-side coupling portion 2573 expands and the support portion 2572 moves in the X2 direction, and the pressed portion 2574 starts swinging in the X2 direction with respect to the support portion 2572.

As shown in FIG. 7, the pressed portion 2574 stops when the insertion portion 2521 reaches the removal-direction-side guide end E2. In addition, as shown in FIG. 5, after the insertion-direction-side coupling portion 2573 extends completely in the X2 direction, the pressed portion 2574 further swings in the X2 direction with respect to the support portion 2572.

It is noted that the insertion-direction-side coupling portion 2573 and the pressed portion 2574 operate reversely to the above-described operation when the insertion portion 2521 moves from the removal-direction-side guide end E2 to the insertion-direction-side guide end E1, and description thereof is omitted.

It is noted that, to realize the expansion and contraction of the insertion-direction-side coupling portion 2573 and the swinging of the pressed portion 2574, the following are at least preset appropriately: a location in the pressed portion 2574 that is pressed by the pressing surface F8; a distance from the support portion 2572; and a thickness of the contact terminal 257.

The removal-direction-side coupling portion 2575 is a first removal-direction-side coupling portion and a second removal-direction-side coupling portion. The removal-direction-side coupling portion 2575 is, at one end thereof, coupled with the other end of the pressed portion 2574.

As shown in FIG. 11, the removal-direction-side coupling portion 2575 stands still in the inner space S while the pressed portion 2574 stands still. At this time, the removal-direction-side coupling portion 2575 extends with respect to the other end of the pressed portion 2574, in a state of being inclined in the projection direction Q in the X2 direction by a predetermined distance.

As shown in FIG. 11, the pressure contact portion 2576 is the other end of the removal-direction-side coupling portion 2575, and in a state where the set surface F7 is stored in the inner space S, the pressure contact portion 2576 contacts and presses the flat conductor 41 on the set surface F7 in a direction perpendicular to the insertion/removal direction X.

The removal-direction-side end portion 2577 is a tip portion of the contact terminal 257 on the X2 direction side, coupled with the pressure contact portion 2576 at one end thereof, and extends, by a predetermined distance, with respect to the pressure contact portion 2576 in a direction away from the set surface F7.

Specifically, as shown in FIG. 9 and FIG. 7, in response to an expansion of the insertion-direction-side coupling portion 2573 caused by the pressing of the pressed portion 2574 by the pressing portion 255, and the swinging of the pressed portion 2574 in the X2 direction, the removal-direction-side coupling portion 2575, the pressure contact portion 2576, and the removal-direction-side end portion 2577 move in the X2 direction so as to be separated from the set surface F7 in the projection direction Q.

As shown in FIG. 7, when the insertion portion 2521 has reached the removal-direction-side guide end E2, namely, when the set surface F7 protrudes outside the housing 251 from the insertion port H1, the removal-direction-side coupling portion 2575, the pressure contact portion 2576, and the removal-direction-side end portion 2577 protrude from the insertion port H1 together with the set surface F7. At this time, the removal-direction-side coupling portion 2575, the pressure contact portion 2576, and the removal-direction-side end portion 2577 are separated with respect to the set surface F7 in the projection direction Q by a distance that is larger than the thickness of the connection portion 4. This facilitates the worker to set the connection portion 4 on the set surface F7.

In addition, since the set surface F7 faces downward, the worker may erroneously let go of his/her hand from the connection portion 4 during a process of setting the connection portion 4 on the set surface F7. However, even if the worker lets go of his/her hand from the connection portion 4, the connection portion 4 is expected to be caught by the removal-direction-side coupling portion 2575, the pressure contact portion 2576, and the removal-direction-side end portion 2577 that protrude from the insertion port H1 below the set surface F7. This improves the workability of the worker.

It is noted that the removal-direction-side coupling portion 2575 and the third projection 2543 are configured not to contact each other while the pressed portion 2574 is moving in the insertion/removal direction X. This prevents the removal-direction-side coupling portion 2575 and the third projection 2543 from wearing.

In addition, as shown in FIG. 7 and FIG. 9, when the pressed portion 2574 swings in the X1 direction in a state where the connection portion 4 is set on the set surface F7, the removal-direction-side coupling portion 2575 swings in a direction opposite to the projection direction Q. This allows the pressure contact portion 2576 to approach the set surface F7 and then contact and press the connection portion 4.

It is noted that the contact terminal 257 is not limited to the above-described configuration, but the pressure contact portion 2576 may be fixedly provided at a predetermined position in the inner space S, and at the position, contact and press the flat conductor 41 stored in the inner space S.

It is to be understood that the embodiments herein are illustrative and not restrictive, since the scope of the disclosure is defined by the appended claims rather than by the description preceding them, and all changes that fall within metes and bounds of the claims, or equivalence of such metes and bounds thereof are therefore intended to be embraced by the claims.

The invention claimed is:
1. A connector comprising:
   a housing in which an insertion port and guide hole are formed, a flat cable being inserted in the insertion port, the guide hole being a through hole passing through the housing in a direction perpendicular to a predetermined insertion direction of the flat cable, the guide hole being elongated in the insertion direction;

a switch configured to move along the guide hole in the insertion direction and a removal direction that is opposite to the insertion direction;

a set portion on which a connection portion of the flat cable is set, the set portion including a set surface that moves in the removal direction and protrudes outside the housing from the insertion port as the switch moves in the removal direction, and moves in the insertion direction and is stored in an inner space of the housing as the switch moves in the insertion direction;

a contact terminal including a pressure contact portion configured to, in the inner space, contact and press, in a direction perpendicular to the insertion direction, a conductor provided in the connection portion;

a mounting terminal which is electrically connected to the contact terminal and protrudes with respect to an outer surface of the housing; and a positioning portion including a first projection, a second projection, and a third projection that project from the set surface, the first projection and the second projection being separated from each other in a predetermined width direction of the flat cable perpendicular to the insertion direction, by a distance that matches a width of the connection portion, the third projection being provided on the insertion direction side with respect to the first projection and the second projection, wherein the third projection has a height that is larger than a thickness of the connection portion with respect to the set surface.

2. An image reading device comprising:
the connector according to claim 1.

3. An image forming apparatus comprising:
the connector according to claim 1.

4. A connector comprising:

a housing in which an insertion port and guide hole are formed, a flat cable being inserted in the insertion port, the guide hole being a through hole passing through the housing in a direction perpendicular to a predetermined insertion direction of the flat cable, the guide hole being elongated in the insertion direction;

a switch configured to move along the guide hole in the insertion direction and a removal direction that is opposite to the insertion direction;

a set portion on which a connection portion of the flat cable is set, the set portion including a set surface that moves in the removal direction and protrudes outside the housing from the insertion port as the switch moves in the removal direction, and moves in the insertion direction and is stored in an inner space of the housing as the switch moves in the insertion direction;

a contact terminal including a pressure contact portion configured to, in the inner space, contact and press, in a direction perpendicular to the insertion direction, a conductor provided in the connection portion;

a mounting terminal which is electrically connected to the contact terminal and protrudes with respect to an outer surface of the housing; and a positioning portion including a first projection, a second projection, and a third projection that project from the set surface, the first projection and the second projection being separated from each other in a predetermined width direction of the flat cable perpendicular to the insertion direction, by a distance that matches a width of the connection portion, the third projection being provided on the insertion direction side with respect to the first projection and the second projection, wherein the third projection has a height that is larger than a thickness of the connection portion with respect to the set surface, and when the set surface protrudes outside the housing, the pressure contact portion is separated with respect to the set surface in a projection direction by a distance that is larger than a thickness of the connection portion, the projection direction being a direction in which the third projection projects and being perpendicular to the insertion direction and the width direction.

5. The connector according to claim 4, further comprising:

a first pressing portion including a first pressing surface and fixed to the switch, the first pressing surface being separated with respect to the third projection in the insertion direction by a predetermined distance and separated with respect to the set surface in the projection direction by a predetermined distance, wherein the contact terminal includes:

a first support portion provided on the projection direction side of the first pressing portion;

a first pressed portion which is coupled with the first support portion, overlaps with the first pressing surface in a planar view viewed in the removal direction, and is interposed between the third projection and the first pressing surface in a planar view viewed in the projection direction; and a first removal-direction-side coupling portion which extends from the first pressed portion in the removal direction in a state of being inclined in the projection direction, and in which the pressure contact portion is provided, and the first pressed portion is pressed by the first pressing surface as the switch moves in the removal direction, thereby the pressure contact portion is separated from the set surface in the projection direction.

6. The connector according to claim 4, wherein
when the set surface protrudes outside the housing, the pressure contact portion protrudes outside the housing from the insertion port.

7. The connector according to claim 6, further comprising:

a second pressing portion including a second pressing surface and fixed to the switch, the second pressing surface being separated with respect to the third projection in the insertion direction by a predetermined distance and separated with respect to the set surface in the projection direction by a predetermined distance, wherein the contact terminal includes:

a fixing portion fixed to the housing at a position on the projection direction side of the second pressing portion;

a second support portion provided on the projection direction side of the second pressing portion and not fixed to the housing;

a second pressed portion which is coupled with the second support portion, overlaps with the second pressing surface in a planar view viewed in the removal direction, and is interposed between the third projection and the second pressing surface in a planar view viewed in the projection direction;

an insertion-direction-side coupling portion coupling the fixing portion with the second support portion and capable of being elastically deformed; and a second removal-direction-side coupling portion which extends from the second pressed portion in the removal direction in a state of being inclined in the projection direction and in which the pressure contact portion is provided, when the second pressed portion is not pressed by the second pressing surface, the insertion-direction-side coupling portion is bent between the fixing portion and the second support portion, and the second support portion is separated with respect to the fixing portion by a predetermined distance in the removal direction, and when the second pressed portion is pressed by the second pressing surface, the insertion-direction-side coupling portion is expanded and the second support portion moves in the removal direction, and the pressure contact portion protrudes outside the housing from the insertion port.

8. The connector according to claim 7, wherein the housing includes an insertion-direction-side inner surface separated in the insertion direction by a predetermined separation distance with respect to an insertion-direction-side guide end which is an end of the guide hole on the insertion direction side, the second pressing portion includes an insertion-direction-side end separated with respect to the insertion-direction-side guide end in the insertion direction by the separation distance, and the pressure contact portion contacts and presses the conductor in a state where the switch abuts on the housing at the insertion-direction-side guide end, and the insertion-direction-side end abuts on the insertion-direction-side inner surface.

* * * * *